United States Patent [19]

Granneman et al.

[11] Patent Number: 5,294,572
[45] Date of Patent: Mar. 15, 1994

[54] METHOD AND APPARATUS FOR DEPOSITING A LAYER ON A SUBSTRATE

[75] Inventors: Ernst H. A. Granneman, Hilversum; Hans W. Piekaar, Utrecht; Hubertus A. Corsius, Nieuwegein; Boudewijn G. Sluijk, Bilthoven, all of Netherlands

[73] Assignee: ASM International N.V., Bilthoven, Netherlands

[21] Appl. No.: 752,487
[22] PCT Filed: Mar. 6, 1990
[86] PCT No.: PCT/NL90/00027
§ 371 Date: Nov. 1, 1991
§ 102(e) Date: Nov. 1, 1991
[87] PCT Pub. No.: WO90/10949
PCT Pub. Date: Sep. 20, 1990

[30] Foreign Application Priority Data

Mar. 6, 1989 [NL] Netherlands .......... 8900544

[51] Int. Cl.$^5$ .......... B08B 3/12; C23C 16/00
[52] U.S. Cl. .......... 437/225; 134/1; 134/2; 118/719; 118/720; 118/725; 148/DIG. 17
[58] Field of Search .......... 118/719, 720, 725; 29/25.01; 437/946; 134/1, 2; 148/DIG. 17

[56] References Cited

U.S. PATENT DOCUMENTS

| 4,500,564 | 2/1985 | Enomoto | 134/1 |
|---|---|---|---|
| 4,568,397 | 2/1986 | Hoke et al. | |
| 4,576,698 | 3/1986 | Gallagher et al. | 134/1 |
| 4,670,126 | 6/1987 | Messer et al. | |
| 4,717,461 | 1/1988 | Strahl et al. | |
| 4,785,962 | 11/1988 | Toshima | |
| 4,797,178 | 1/1989 | Bui et al. | 134/1 |
| 4,817,557 | 4/1989 | Diem et al. | |
| 4,836,905 | 6/1989 | Davis et al. | |
| 4,846,425 | 7/1989 | Champetier | 134/1 |
| 4,951,601 | 8/1990 | Maydan et al. | |
| 4,960,488 | 10/1990 | Law et al. | 134/1 |
| 5,019,233 | 5/1991 | Blake et al. | |
| 5,067,218 | 11/1991 | Williams | 29/25.01 |
| 5,076,205 | 12/1991 | Vowles et al. | |

FOREIGN PATENT DOCUMENTS

| 0242997 | 10/1987 | European Pat. Off. | |
|---|---|---|---|
| 0289194 | 11/1988 | European Pat. Off. | |
| 385590 | 7/1990 | European Pat. Off. | |
| 2132322 | 6/1987 | Japan | |
| 258416 | 10/1989 | Japan | |
| 2-14522 | 1/1990 | Japan | 134/1 |
| 2190345 | 11/1987 | United Kingdom | |

OTHER PUBLICATIONS

"Continuous Process CVD System", Solid State Technology, vol. 30, No. 10, Oct. 1987, pp. 49-50.

Primary Examiner—Olik Chaudhuri
Assistant Examiner—Ramamohau Rao Paladugu
Attorney, Agent, or Firm—Young & Thompson

[57] ABSTRACT

Method and apparatus for the batchwise simultaneous treatment of several substrates by chemical vapor deposition. The method is carried out in a closed system and before the deposition treatment, the substrates are subjected to a cleaning treatment in the same system.

7 Claims, 4 Drawing Sheets

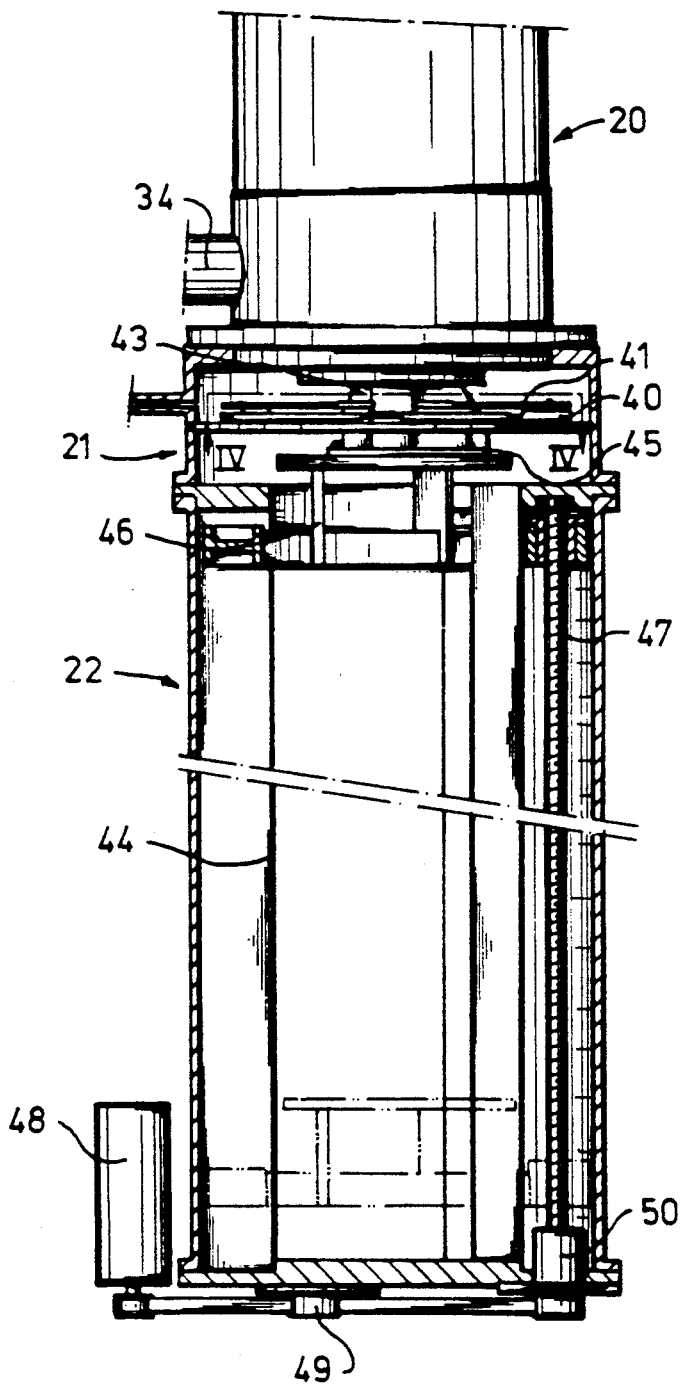

METHOD AND APPARATUS FOR DEPOSITING A LAYER ON A SUBSTRATE

FIELD OF THE INVENTION

The present invention relates to a method and apparatus for depositing a layer on a substrate.

BACKGROUND OF THE INVENTION

Such a method, is known from "SOLID STATE TECHNOLOGY, Volume 30, No. 10, pages 49-50. According to that method deposition is realized in a process chamber in which several wafers are positioned on the same horizontal plane adjacent to each other. For loading and unloading, it is necessary to rotate the wafers on a horizontal table to position them before a pick-up device. Except for the considerable floor requirement of such a device, the transport path of the several wafers is relatively long. This impairs the effectiveness and cleanliness of the processes in the process chambers.

In the solid state technology there is a continuous tendency to increase wafer size. Because of the increased wafer size at a given space for a horizontal table the number of wafers which can be processed simultaneously decreases, increasing processing costs. Increasing table size has structural limits. Furthermore problems have been encountered during evacuating the above chamber, because of the relatively large sealing surfaces.

The invention aims to provide a method in which deposition can be realized in an effective way both with regard to time and costs, and wherein cleanliness of several processes in the system can be guaranteed by shortening the transport path.

According to the invention this is realized with the characterizing features recited in the claims.

In U.S. Pat. No. 4,717,461 a method is described for depositing a layer on a substrate by sputtering. After being introduced into a loading/unloading station, the substrate is transferred to a treatment chamber. After a layer has been deposited, it is then subjected to an etching procedure in order to achieve the required configuration. Characteristic is the fact that the treatment stations can hold and treat only one substrate at the same time.

Sputtering has a number of advantages and disadvantages. Characteristic of sputtering is the ballistic nature of the process. As a result of this, it is ultimately impossible to provide deep narrow holes and grooves, which are typical of the structure in, for example, megabit patterns, uniformly with a layer or to remove a layer. For this reason, chemical vapour deposition of materials at elevated temperature is also used in the prior art. Such a method is described, for example, in GB-A 2,190,345. In that case, the substrates are transferred directly into a processing furnace. In doing so, however, problems arise in relation to contaminants present on the surface. Metal ion contaminants left behind may be regarded in the first place as contaminants, but the substrate oxide, which is always produced when the substrate is exposed to the air, must also be perceived as such. A final contaminant is represented by molecules adsorbed on the substrate (primarily hydrocarbons).

In the case of sputtering, any contaminants present are removed from the surface by a bombardment with high-energy (50 eV and higher) atoms before the sputtering treatment is started, the so-called sputter etch. A disadvantage of this etching process is the production of damage to, and defects in, the crystal lattice of the substrate as a result of the incidence of the bombarding atoms. The incident atoms penetrate the substrate and, together with a certain fraction of the contaminants, are trapped in the top layer of the substrate. The more the technology advances and increasingly higher requirements have to be imposed on the integrity of the increasingly thinner layers, the more the above-mentioned sputter etch is increasingly inadequate and a search has to be made for methods in which the substrate oxide and the atoms adsorbed on the substrate are removed without undesirable atoms being incorporated in the top layer of the substrate and without defects in the crystal lattice of the substrate being the result of the cleaning process. In addition, it is necessary to ensure that the cleaned surface is not exposed to the air again. In the case of chemical vapour deposition, there is the advantage that structures can be uniformly provided with a layer, but there is the disadvantage that such a cleaning does not take place in the same apparatus. This is one of the big disadvantages of chemical vapour deposition in which use has hitherto been made of separate apparatuses for the removal of contaminants and the application of layers.

SUMMARY OF THE INVENTION

The object of the present invention is to provide a method of the type described above which can be applied to chemical vapour deposition (CVD).

This object is achieved with a method described above in that the deposition method comprises the batchwise simultaneous treatment of several substrates by chemical vapour deposition of a layer of material at elevated temperature, and in that the substrates are subjected to a cleaning treatment before the deposition treatment in the treatment system. Cleaning the substrate in the closed system and then submitting it, in the still closed system, to a treatment apparatus ensures that the substrate is subjected to the method of chemical vapour deposition of materials without any contamination. Such a cleaning step may comprise plasma cleaning, chemical cleaning without exposure to high-energy (more than 50 eV as is usual in sputtering) atoms, with an energy of less than 50 eV and to chemical cleaning such as with HF and as described in the application Ser. No. 431,149 filed on Nov. 3, 1989 now U.S. Pat. No. 5,167,761, or by means of exposure to vapour containing ozone. Such a cleaning step must be distinguished from the etching step as is shown from the above-mentioned U.S. Pat. No. 4,717,461. In that case, the etching is carried out as a treatment for obtaining the final substrate. That is to say, the treatment is essential for the substrate, while the cleaning in the case of the present application is necessary for removing any surface contaminants. Carrying out the deposition treatment for several substrates simultaneously improves the efficiency of the method. In contrast to sputtering, chemical vapour deposition is a comparatively slow process. The average substrate throughput time can be limited by simultaneously treating a number of substrates.

The invention also relates to a processing system. According to the invention this processing system has the features recited in the apparatus claims. In this manner, the substrate can be subjected to a cleaning treatment before the treatment. Because the treatment of depositing a layer takes place an elevated temperature, as described above, and the temperature (up to 1000° C.) may be appreciably higher than that required in sputter deposition, with the result that the thermal stressing is many times greater than for the apparatus mentioned in U.S. Pat. No. 4,174,461, a problem arises in coupling a distribution chamber such as is known from U.S. Pat. No. 4,717,461 to a vertical treatment tower such as is known from GB-A-2,190,345. As a result of the exposure to heat, both the lift mechanism provided in the chamber below the furnace and the handling apparatus provided in the distribution chamber will fail if, after the deposition of the layer, the substrates are unloaded immediately by means of the above-mentioned handling apparatus without a lengthy cooling period. According to a further advantageous embodiment of the invention, a heat lock is provided between the treatment chamber and the distribution chamber, which heat lock ensures that only a minimum heat flow is able to reach the distribution chamber, incorporating the handling apparatus provided, during the treatment. This may comprise a heat shield, but also an assembly of thermally insulating materials. Such a problem exists to a much lesser degree in a conventional vertical furnace (GB-A-2,190,345) owing to the fact that the lift is in that case not situated in a vacuum chamber. The treatment apparatus according to the invention may, moreover, be equipped for the subsequent treatment of the substrates after one another in the vertical direction and, at the same time, the substrate transfer means in the distribution chamber may be constructed for moving the substrates in the horizontal direction. In this manner, use is made of available space in as expedient a manner as possible. As a result of the vertical treatment, thermal and chemical control over the substrates can be obtained in a very well regulated manner.

Because the substrates have to be additionally heated in certain processes during the treatment, separate means are present for heating substrates in the treatment apparatus and, in particular, the treatment chamber. In conditioning processes, in particular, in which material is deposited from the surrounding gas, a concentration gradient will frequently occur over the different substrates. In that case, it is advantageous to provide a compensating temperature gradient. If conditioning gases are used, it is frequently also advantageous to pre-heat. The treatment chamber described above may occur several times in the treatment system described above.

BRIEF DESCRIPTION OF THE DRAWINGS

The invention will be explained in more detail below with reference to some exemplary embodiments shown in the drawing.

In the drawings:

FIGS. 3a and 3b show in more detail in section parts of the processing vessel depicted in FIGS. 2a and 2b on different scale.

DETAILED DESCRIPTION OF THE INVENTION

Figure 1:
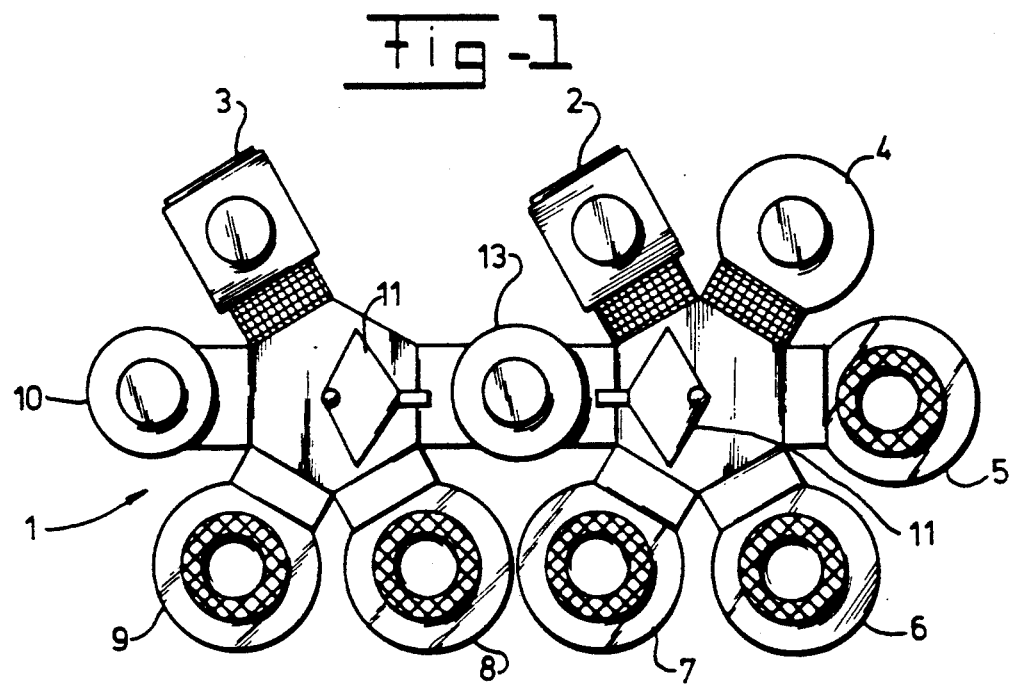
FIG. 1 diagrammatically shows a processing system according to the invention in plan view.

FIG. 1 depicts a processing system according to the invention which is indicated as a whole by 1. This comprises an inlet port 2 for introducing substrates, such as wafers, to be treated. These may be introduced separatley or in magazines. The processing system 1 comprises, in addition, an outlet port 3 for removal therefrom. After the inlet port 2, a cleaning apparatus 4 is provided, followed by reaction chambers 5, 6, 7, 8, 9. The reference numeral 10 indicates an adjustment station. To transport the substrates from the inlet port to the various processing chambers, handling apparatuses 11 are present which are capable of transporting the wafers (not shown) from the inlet port 2 piece by piece to the various chambers. Between the two handling apparatuses 11, a transfer apparatus indicated diagrammatically by 13 is present. Such a processing system can be used, for example, for depositing a so-called ONO configuration on a wafer. For certain integrated circuits, such as oxide layer/nitride layer/oxide layer sequence is of importance. However, it was difficult to achieve such layers in the prior art because it was possible for oxidation to occur in an uncontrolled manner on removing the substrate from the processing vessel, with all the disadvantageous consequences thereof. With the present invention it is now possible to avoid these disadvantages. At the same time, the wafers to be treated are introduced into the inlet port 2 in magazines. These are then removed one by one by the handling apparatus 11 and transferred to the cleaning apparatus 4. In this process cleaning and, in particular, removal of oxides is achieved, for example, with hydrogen fluoride. The wafers are then treated in the various chambers. In chamber 5, for example, dry oxidation may take place. Subsequent thereto, the nitride layer may be deposited in chamber 7, while wet oxidation is then used in chamber 8 or 6. During transfer between the different chambers, the substrate to be treated is always in a conditioned environment, i.e. ambient oxygen cannot affect the substrate. As a result, it is not necessary to clean the substrate every time. Because the wet oxidation and nitriding processes described above are comparatively length, it is advantageous to load several substrates into one of the chambers, to seal it off and to treat them simultaneously so that the average treatment time per wafer is shortened. Chamber 9 then serves to apply an undoped polysilicon layer, while chamber 10 serves to cool the substrate from the high temperature at which it is treated. The substrate is then removed via the outlet port 3.

Figures 2A, 2B:
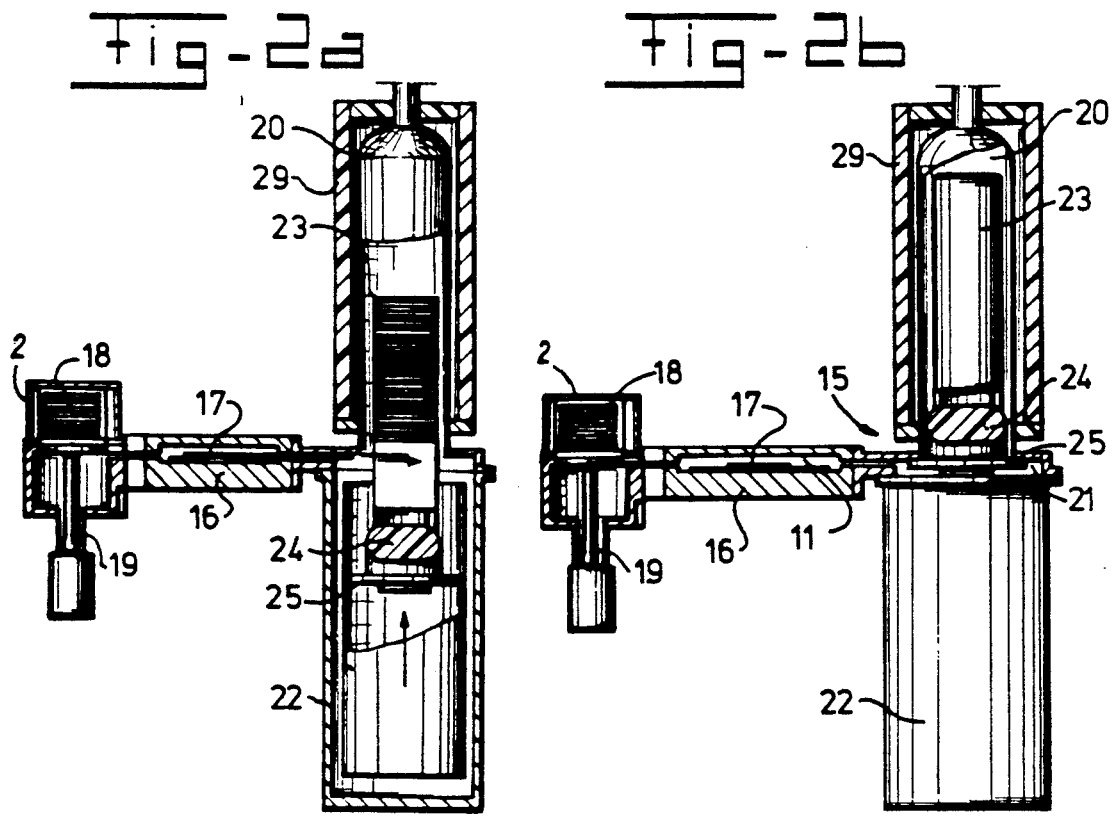
FIGS. 2a and 2b diagrammatically show a further embodiment of the processing system according to the invention in side elevation.

FIGS. 2a and 2b diagrammatically show in section a part of a similar treatment system according to the invention. This comprises an inlet port 2, a distribution vessel 16 and a processing vessel indicated as a whole by 15. It is clear that this is an incomplete reproduction because in practice further treatment apparatuses are connected to the distribution vessel 16. In the embodiment shown here, the substrates indicated by 17 are introduced into the inlet port 2 in magazines 18. The handling apparatus 11 for the substrates handles only one substrate simultaneously, with the result that one of the substrates 17 is transferred in each case from the magazine 18 to a point in front of the opening of the distribution vessel by means of the indexing mechanism 19. The processing vessel 15 comprises a processing chamber 20 with a magazine 23, a loading and unloading chamber 21 and a storage chamber 22 provided therein. At the same time, the storage chamber 22 is provided with means, which are not shown, for raising and lowering the magazine 23. This chamber can also be uncoupled from the rest of the apparatus. The treatment chamber 20 is surrounded by a diagrammatically shown heating device 29. The inlet port 2 is provided with a mechanism 19 for bringing the substrates in the magazine 18 into the correct position for the handling device 11 to be able to act on them. From FIG. 2b, it is evident that, if the wafers 17 are introduced in the manner indicated in FIG. 2a, magazine 23 is raised. Treatment chamber 20 is separated from the rest of the treatment system by the diagrammatically shown sealing means 25, with the result that products used and/or produced during the treatment cannot penetrate the rest of the processing system. If heating is used during the processing, it is desirable to provide thermal insulation 24.

To clean the magazine 23, it is introduced into the storage chamber 22 after which the store 22 is separated from the rest of the processing system. Then the magazine 23 is raised upwards out of the storage chamber 22 for further cleaning.

Figure 3A:
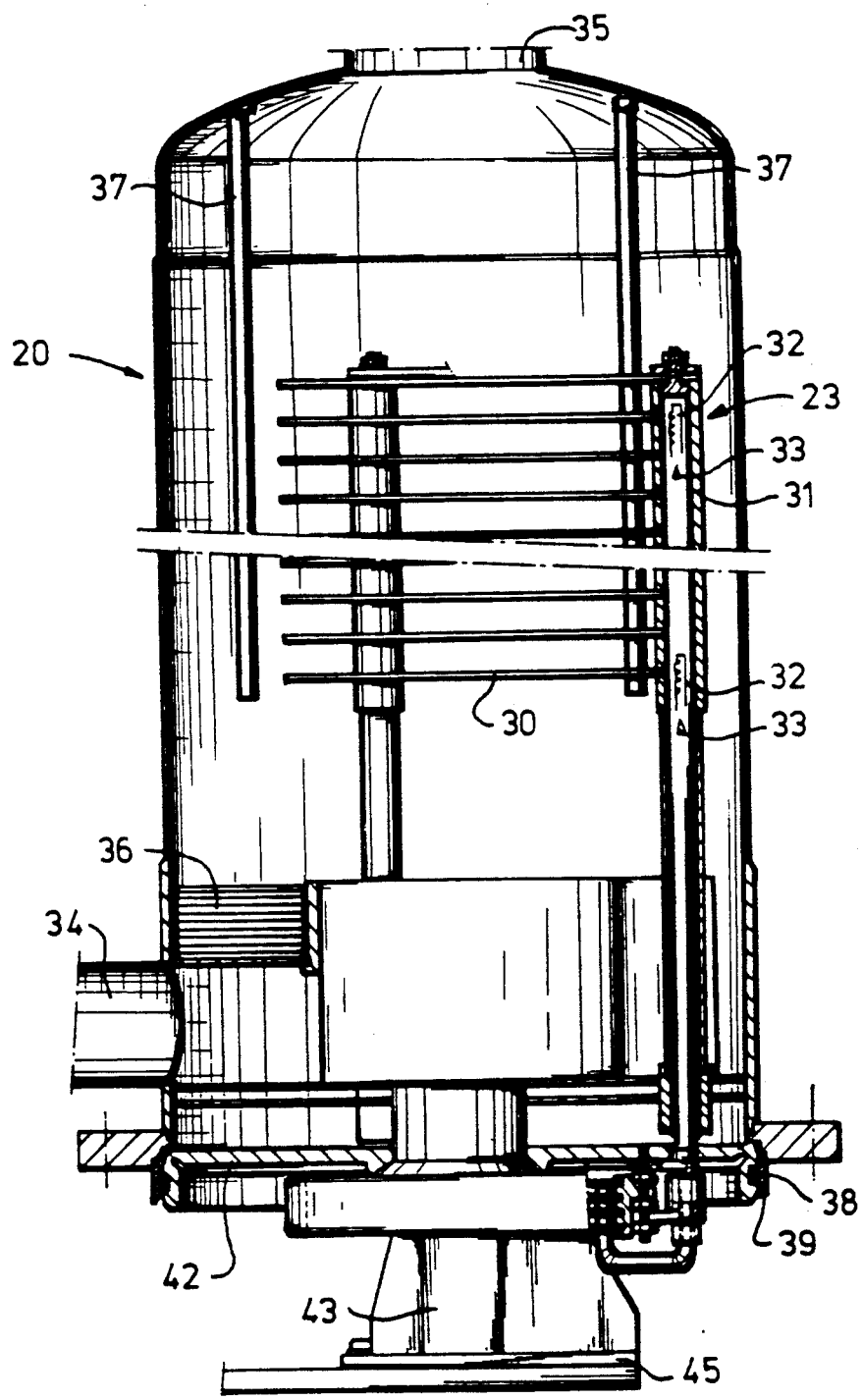

FIGS. 3a and b show a processing vessel suitable, in particular, for the deposition of material on a substrate from a reactive vapour. Because this is frequently a comparatively lengthy process (not less than several hours), it is necessary to carry it out batchwise to achieve an adequate production efficiency. For this purpose, the magazine 23 indicated as a whole comprises carrier plates 30 (FIG. 3a). These may be manufactured from various materials. In the embodiment described here, it is necessary to heat the substrates (not shown) subsequently deposited on the carrier plates, with the result that the carrier plates 30 are composed of a heat-conducting material. Such heating is usually an auxiliary heating, the heating, not depicted here, on the outside of the vessel (see FIG. 2) being the main heating. Preferably, graphite is used for the plates. The plates are fitted at the ends in tubes 31, two of the four being visible in FIG. 3. Diagrammatically depicted heating elements 32 and also temperature sensors 33 are provided in said tubes 31. Because various temperature sensors and heating elements are present, it is possible to achieve a temperature gradient over the various carrier plates 30. The processing vessel 20 is provided with a gas inlet 34 and also an outlet 35. Because it is necessary to preheat the gas for the method described above, heating means 36 are provided for this purpose. Because the gas becomes increasingly depleted as it passes through the vessel 20 towards the outlet, it is necessary for the reactivity of the gas to be greater in the vicinity of the outlet 35 than at the bottom of the vessel in order to obtain a uniform deposit on the various substrates. This is achieved by choosing the temperature of the carrier plates 30 higher at the top of the vessel than the temperature at the bottom of the vessel. In order to be able to clean the vessel, electrodes 37, with the aid of which cleaning can be provided at high frequency, are present. The loading and unloading chamber 21 (FIG. 3b) is connected to the processing vessel 20.

Figure 4:
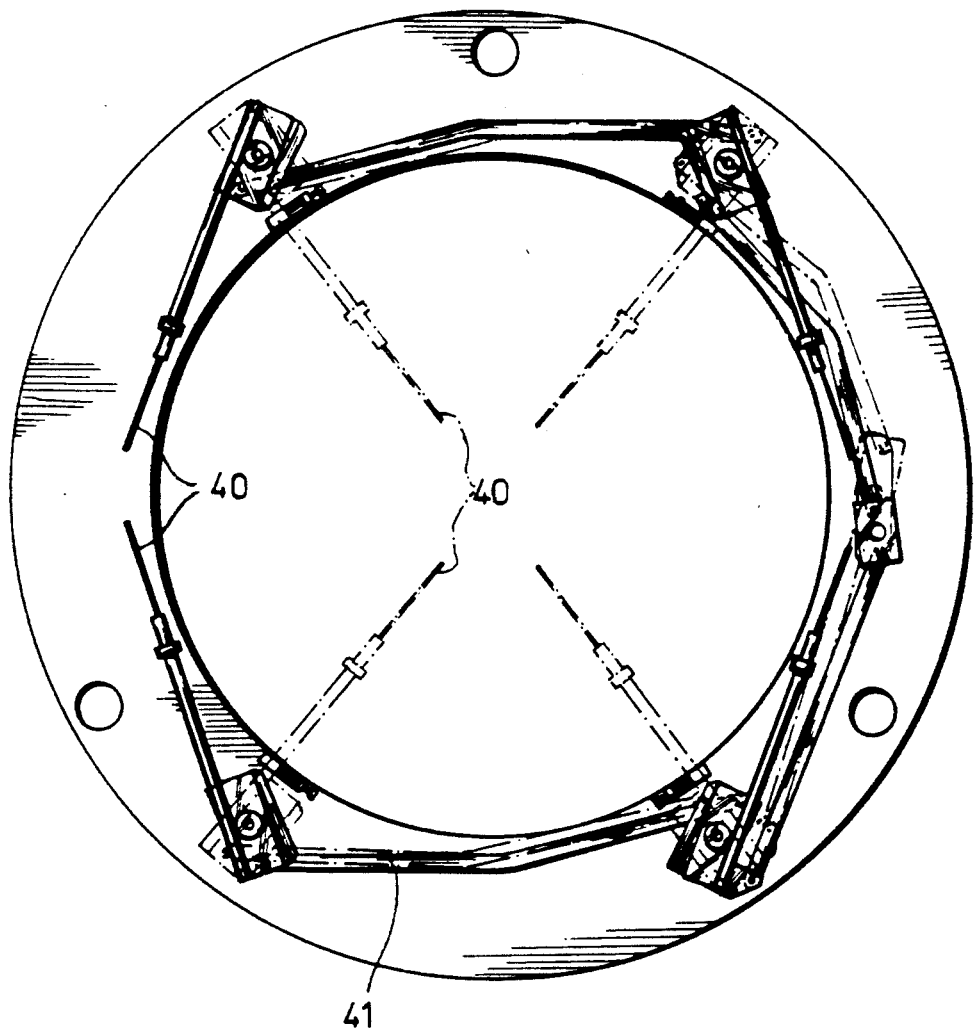
FIG. 4 shows a cross section along the line IV—IV in FIG. 3b.

The cross sectional view shown in FIG. 4 illustrates the operation thereof. From this it is evident that four fingers 40, which are able to rotate inwards into the position shown by broken lines by means of a linkage system 41, are present. Normally, the fingers 40 will be in the position shown by full lines. The carrier plates 30 are provided, in a manner not shown, with slots in a manner such that, if the fingers 40 are in the state shown by broken lines, they are able to move through the slots in the carrier plates 30. In order to remove a substrate 30 situated on the carrier plates, it is necessary to move the carrier plate 30 concerned into the loading and unloading chamber 21 in a suitable manner. In this process, the carrier plates concerned are lowered or raised to an extent such that the fingers 40 can just move through them. Then the fingers 40 are moved to the position shown with broken lines. If the carrier plates are then allowed to drop, the substrate is freed from the carrier plate, as a result of which it can be taken out of the loading and unloading chamber 21 by handling apparatus 11. During loading, the substrate can be laid on the fingers in this position, after which the carrier plate is raised further.

FIG. 3a indicates that the treatment vessel is provided with a sealing edge 38 at the bottom. This can be acted on by a O-seal 39 to provide a seal. In this manner, the treatment chamber can be separated completely from the rest of the treatment system. Plate 42 can be raised and lowered with all the apparatus provided thereon, comprising in particular the carrier plates 30, by means of coupling 43 which is connected to a jacking apparatus provided in storage chamber 22. As is evident from FIG. 3b, the diameter of said storage chamber 22 is substantially larger than that of the magazine 23 present in the treatment vessel 20. As a result, it is possible to allow the magazine 23 to move downwards between the heat shields 44 provided in the storage chamber 22. Coupling part 43 is connected to flange 45 which then acts on table 46 in which three threaded spindles 47 are provided for raising and lowering. The position shown with broken lines indicates the lowest position. The threaded spindles 47 are driven by means of motor 48 and transmission 49, sealing means 50 being present in order to provide vacuum-tight lead-through of the drive.

Although the invention has been described above, in particular, with reference to deposition on substrates from gases, it must be understood that the invention is not limited thereto and that it also extends to processes in which other reactive gases, or no reactive gases.

An example thereof is an embodiment in which the consecutive carrier plates are insulated with respect to one another and an RF field is applied between the plates. Such a method is used in a different apparatus described in U.S. Pat. No. 4,610,748.

In addition, it is possible to construct the magazine as a so-called quartz boat with slots, as a result of which the structures described above and having fingers become unnecessary because the wafers can be acted on at the edges.

Only the characteristics such as those for which protection is claimed in the following claims are essential.

We claim:

1. Method for the simultaneous deposition of a layer on a plurality of substrates by receiving said substrates in a processing system, having several subsystems which can each and together be sealed with respect to the environment, comprising: introducing the substrates into said processing system, depositing a layer on the substrates in a subsystem, said depositing comprising the batchwise simultaneous treatment of several substrates by chemical vapor deposition of a layer of material at elevated temperature, and removing the substrates from said system, wherein during said depositing the substrates are vertically stacked above each other, and wherein the substrates are individually or batchwise subjected to a cleaning treatment with exposure to plasmas of energy less than 50 eV in a further subsystem before said depositing in the processing system.

2. Method according to claim 1 wherein the cleaning treatment comprises a chemical cleaning.

3. Processing system for carrying out the simultaneous deposition of a layer on a plurality of substrates which comprises: a number of chambers connected via at least one distribution chamber incorporating substrate transfer means, at least one loading and unloading chamber which can be sealed off with respect to the distribution chamber and at least one processing chamber which can be sealed off with respect to the distribution chamber, an apparatus for depositing a layer of material from a processing gas at elevated temperature, said distribution chamber being arranged to handle one substrate in each case, said processing chamber being provided with means for supporting a plurality of substrates, stacked vertically above each other for the simultaneous processing of the substrates in the vertical direction, a cleaning chamber provided between the loading chamber and the processing chamber, said cleaning chamber adapted to receive, clean with exposure to plasmas of energy less than 50 eV and discharge a single or a plurality of substrates, and wherein the substrate transfer means in the distribution chamber include means for moving the substrates in a horizontal direction.

4. Processing system according to claim 3, wherein a thermal seal is provided between the processing chamber and the distribution chamber.

5. Processing system according to claim 4, wherein the thermal seal comprises a heat shield.

6. Processing system according to claim 3, wherein the processing chamber includes heating means arranged to establish a temperature gradient over the processing chamber.

7. Processing system according to claim 3, further including heating means for heating the processing gas.

* * * * *